United States Patent
Hahm et al.

(10) Patent No.: US 10,269,913 B2
(45) Date of Patent: Apr. 23, 2019

(54) THIN FILM TRANSISTOR, MAKING METHOD THEREOF, AND ELECTRONIC DEVICE COMPRISING THEREOF

(71) Applicant: Samsung Electronics Co., Ltd., Suwon-si, Gyeonggi-do (KR)

(72) Inventors: Suk Gyu Hahm, Gyungju-si (KR); Jeong Il Park, Seongnam-si (KR); Youngjun Yun, Yongin-si (KR); Joo Young Kim, Hwaseong-si (KR); Yong Uk Lee, Gwangju-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/864,275

(22) Filed: Jan. 8, 2018

(65) Prior Publication Data

US 2018/0233569 A1  Aug. 16, 2018

(30) Foreign Application Priority Data

Feb. 15, 2017  (KR) ........................ 10-2017-0020535

(51) Int. Cl.
*H01L 51/05* (2006.01)
*H01L 29/423* (2006.01)
(Continued)

(52) U.S. Cl.
CPC .. *H01L 29/42384* (2013.01); *H01L 21/28158* (2013.01); *H01L 29/41733* (2013.01);
(Continued)

(58) Field of Classification Search
CPC ........... H01L 29/7856; H01L 27/14614; H01L 39/08; H01L 27/14602
See application file for complete search history.

(56) References Cited

U.S. PATENT DOCUMENTS

| 5,614,729 A | 3/1997 | Ukai et al. |
| 6,362,027 B1 | 3/2002 | Yamazaki et al. |

(Continued)

FOREIGN PATENT DOCUMENTS

| EP | 1 748 344 A2 | 1/2007 |
| JP | H08078699 A | 3/1996 |

(Continued)

OTHER PUBLICATIONS

Extended European Search Report for EP Appl. No. 18156640.7 dated Jul. 11, 2018.

*Primary Examiner* — Fernando L Toledo
*Assistant Examiner* — Valerie N Newton
(74) *Attorney, Agent, or Firm* — Harness, Dickey & Pierce, P.L.C.

(57) ABSTRACT

A thin film transistor includes a gate electrode on a semiconductor layer, a first insulation layer between the semiconductor layer and the gate electrode, a second insulation layer on the gate electrode, and a source and drain electrode on the semiconductor layer. The gate electrode includes a first part and a second part adjacent to the first part. A width of the second part is greater than a width of the first part. The source electrode and the drain electrode are on the semiconductor layer and arranged such that the first part of the gate electrode is between the source electrode and the drain electrode. The source electrode and the drain electrode are electrically connected to the semiconductor layer through the first insulation layer and the second insulation layer, respectively. A space between the source electrode and the drain electrode is greater than the width of the first part.

21 Claims, 8 Drawing Sheets

(51) Int. Cl.
    *H01L 29/417*    (2006.01)
    *H01L 21/28*     (2006.01)
    *H01L 27/32*     (2006.01)

(52) U.S. Cl.
    CPC ........ *H01L 51/055* (2013.01); *H01L 51/0533* (2013.01); *H01L 51/0541* (2013.01); *H01L 27/3274* (2013.01)

(56) References Cited

U.S. PATENT DOCUMENTS

| | | | |
|---|---|---|---|
| 6,545,359 | B1 | 4/2003 | Ohtani et al. |
| 9,117,916 | B2 | 8/2015 | Hatano et al. |
| 9,293,599 | B2 * | 3/2016 | Hondo ................ H01L 29/7869 |
| 9,799,773 | B2 * | 10/2017 | Godo ................ H01L 29/42384 |
| 2003/0015703 | A1 | 1/2003 | Yamazaki et al. |
| 2004/0164297 | A1 | 8/2004 | Kaneko et al. |
| 2005/0029593 | A1 | 2/2005 | Kudo et al. |
| 2010/0176379 | A1 | 7/2010 | Kim et al. |
| 2012/0037915 | A1 * | 2/2012 | Kugler ................ H01L 51/0012 257/66 |
| 2017/0194458 | A1 * | 7/2017 | Chang ............... H01L 29/66545 |

FOREIGN PATENT DOCUMENTS

| | | |
|---|---|---|
| KR | 100511172 B1 | 8/2005 |
| KR | 2013/0035744 A | 4/2013 |

\* cited by examiner

THIN FILM TRANSISTOR, MAKING METHOD THEREOF, AND ELECTRONIC DEVICE COMPRISING THEREOF

CROSS-REFERENCE TO RELATED APPLICATION

This application claims priority under 35 U.S.C. § 119 to Korean Patent Application No. 10-2017-0020535, filed in the Korean Intellectual Property Office on Feb. 15, 2017, the entire contents of which are incorporated herein by reference.

BACKGROUND

1. Field

A thin film transistor, a method of making the same, and an electronic device including the thin film transistor are disclosed.

2. Description of Related Art

A display device such as a liquid crystal display (LCD), an organic light emitting diode (OLED) display, and the like includes a pair of electric field-generating electrodes and an electrical optical active layer disposed therebetween. The liquid crystal display (LCD) includes a liquid crystal layer as an electric optical active layer, and the organic light emitting diode (OLED) display includes an organic emission layer as an electrical optical active layer.

One of the pairs of the electric field-generating electrodes is commonly connected to a switching device and receives an electrical signal, and the electrical optical active layer transforms the electrical signal into an optical signal and thus displays an image.

In addition, as research and development of a physically modifiable display device such as a flexible display and a rollable display has recently been actively made, appliances including various display devices (e.g., a liquid crystal display (LCD), an organic light emitting diode (OLED) display, a conventional flat panel display, etc.) have come to the fore.

Display devices may include a thin film transistor (TFT) that is a three-terminal element as a switching element. Researches on an organic thin film transistor (OTFT) including an organic semiconductor such as a low molecular weight semiconductor or polymer semiconductor instead of an inorganic semiconductor such as a silicon (Si) semiconductor of these thin film transistors are being actively conducted.

Various attempts to change a disposition relationship of an internal structure of a device, a material for internal constituent elements consisting thereof, or the like have been made.

SUMMARY

Inventive concepts provide a high performance thin film transistor widely applicable to various display devices as well as a flat panel display, a method of making the same, and an electronic device including the same.

According to some example embodiments, a thin film transistor includes a semiconductor layer; a gate electrode on the semiconductor layer, the gate electrode overlapping with a part of the semiconductor layer, the gate electrode including a first part and a second part adjacent to the first part, a width of the second part being greater than a width of the first part; a first insulation layer between the semiconductor layer and the gate electrode; a second insulation layer on the gate electrode; and a source electrode and a drain electrode on the semiconductor layer. The source electrode and the drain electrode may be arranged such that the first part of the gate electrode may be between the source electrode and the drain electrode. The source electrode and the drain electrode may be electrically connected to the semiconductor layer through the first insulation layer and the second insulation layer, respectively. A space between the source electrode and the drain electrode may be greater than the width of the first part.

In some example embodiments, the first part may include a first side facing the source electrode and a second side facing the drain electrode. At least one of the first side and the second side may include a groove.

In some example embodiments, the groove may have a dented shape from an upper side of the first part and a lower side of the first part toward a central part of the first part.

In some example embodiments, a depth of the groove may range from about 0.1 µm to about 1 µm.

In some example embodiments, a first spacing distance may be a shortest distance between the first side and the source electrode. The first spacing distance may range from about 5 µm to about 10 µm.

In some example embodiments, a second spacing distance may be a shortest distance between the second side and the drain electrode. The second spacing distance may range from about 5 µm to about 10 µm.

In some example embodiments, a ratio of the space between the source electrode and the drain electrode relative to the width of the first part may range from about 1.005 to about 1.05.

In some example embodiments, a width of the second part may be equal to or larger than a space between the gate electrode and the source electrode.

In some example embodiments, the gate electrode may include two of the second part, and the first part may be between the two of the second part.

In some example embodiments, the semiconductor layer may be an organic semiconductor layer.

In some example embodiments, an electronic device may include the thin film transistor.

In some example embodiments, the electronic device may be one of a liquid crystal display (LCD), an organic light emitting diode device, an electronic tag, and an electronic sensor.

A method of making the thin film transistor according to some example embodiments includes forming a first insulation layer on a semiconductor layer; forming a gate electrode on the first insulation layer; forming a second insulation layer on the gate electrode; forming a contact hole through at least one part of the first insulation layer, the second insulation layer, and the gate electrode; and forming a source electrode and a drain electrode electrically connected to the semiconductor layer through the contact hole. The gate electrode may overlap with a part of the semiconductor layer. The gate electrode may include a first part and a second part adjacent to the first part. A width of the second part may be greater than a width of the first part. The source electrode and the drain electrode may be arranged such that the first part of the gate electrode may be between the source electrode and the drain electrode. A space between the source electrode and the drain electrode may be greater than the width of the first part.

In some example embodiments, the forming the contact hole may include designating a region overlapped with at least a part of the gate electrode as a contact hole forming region, and then removing the contact hole forming region designated in the gate electrode and the second insulation layer.

In some example embodiments, the forming the contact hole may include surface-processing an exposed part of the gate electrode through the contact hole during the forming the contact hole.

In some example embodiments, the surface-processing may include etching the exposed part of the gate electrode through the contact hole.

In some example embodiments, the method may further include etching the first insulation layer in the contact hole forming region to expose a part of the semiconductor layer after the removing the contact hole forming region designated in the gate electrode and the second insulation layer.

In some example embodiments, the designating the contact hole forming region may include designating a region overlapped with one side of the gate electrode as a first contact hole forming region, and designating a region overlapped with an other side of the gate electrode opposite to the first contact hole forming region with a reference to the gate electrode as a second contact hole forming region.

In some example embodiments, the semiconductor layer may be an organic semiconductor layer, and the semiconductor layer may be formed through a solution process or a deposition process.

In some example embodiments, the source electrode and the drain electrode may be formed through a sputtering deposition or an atomic layer deposition.

According to some example embodiments, a thin film transistor may include a semiconductor layer, a source electrode and a drain electrode on the semiconductor layer, a first insulation layer on the semiconductor layer, and a gate electrode on the first insulation layer. The source electrode and the drain electrode may be spaced apart from each other by a first space and may be electrically connected to the semiconductor layer. The gate electrode may extend through the first space between source electrode and the drain electrode. The gate electrode may include a first part connected to a second part. The first part of the gate electrode may extend through the first space. A width of the first part may be less than a width of the first space. A width of the second part may be greater than a width of the first part. A sidewall of the first part of the gate electrode may have a concave shape.

In some example embodiments, the width of the second part may be greater than the width of the first space.

In some example embodiments, the gate electrode may have a dumbbell shape. The second part of the gate electrode may correspond to one end of the gate electrode.

In some example embodiments, the thin film transistor may further include a second insulation layer. A first portion of the second insulation layer may cover a top surface of the gate electrode. A second portion of the second insulation layer may be between a top surface of the first insulation layer and a bottom surface of the source electrode. A third portion of the second insulation layer may be between the top surface of the first insulation layer and a bottom surface of the drain electrode.

In some example embodiments, the semiconductor layer may be an organic semiconductor layer.

In some example embodiments, a thin film transistor having improved device characteristics and widely applicable to various display devices as well as a flat panel display may be provided.

BRIEF DESCRIPTION OF THE DRAWINGS

FIG. 4 is an enlarged view of a part of FIG. 3, and FIGS. 5 to 11 are views sequentially showing a process of making a thin film transistor according to some example embodiments.

DETAILED DESCRIPTION

Example embodiments will hereinafter be described in detail, and may be easily realized by those who have common knowledge in the related art. However, this disclosure may be embodied in many different forms and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, a film, a region, or a substrate is referred to as being "on" another element, it can be directly on the other element or intervening elements may also be present. In contrast, when an element is referred to as being "directly on" another element, there are no intervening elements present.

Hereinafter, referring to FIGS. 1 and 2, a schematic structure of a thin film transistor 10 according to some example embodiments is described.

Figure 1:
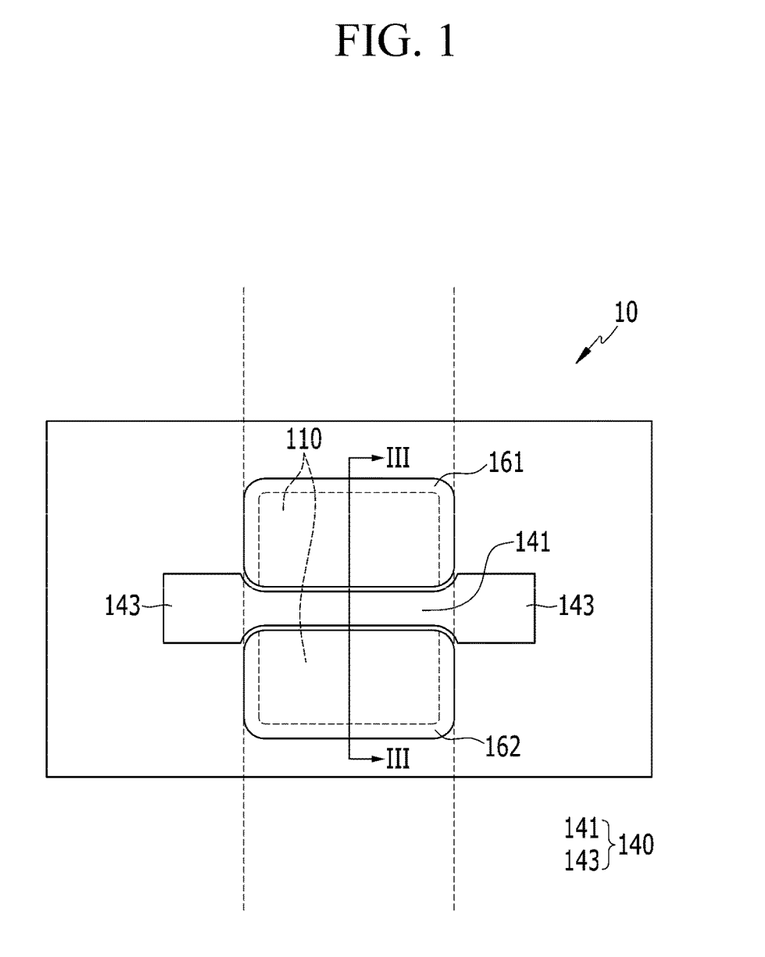
FIG. 1 is a schematic top view showing a thin film transistor according to some example embodiments.
Figure 2:
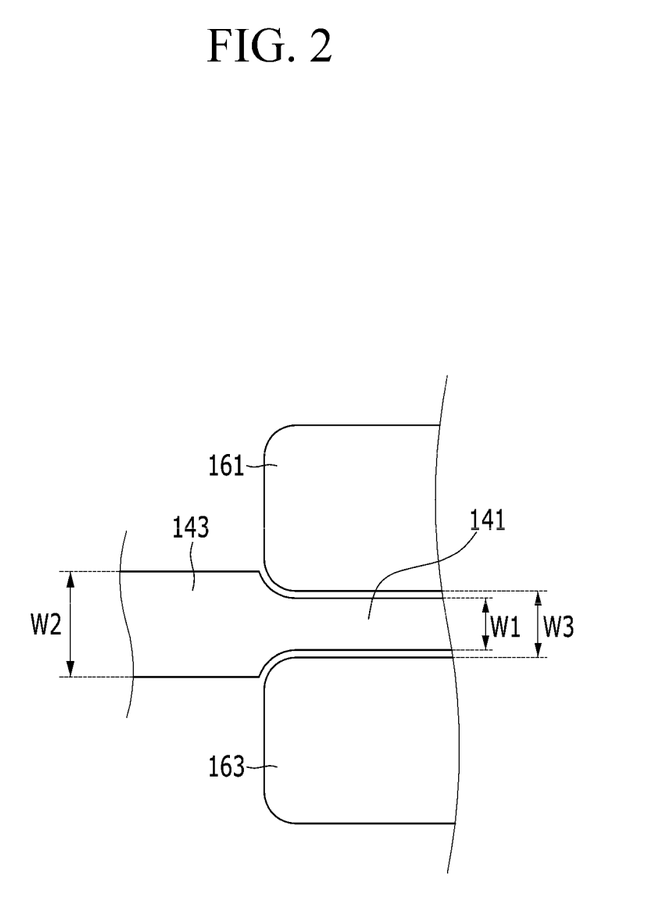
FIG. 2 is an enlarged view showing a part of FIG. 1.

FIG. 1 is a schematic top view showing a thin film transistor according to some example embodiments and FIG. 2 is an enlarged view of a part of FIG. 1.

As shown in FIG. 1, a thin film transistor 10 according to some example embodiments includes a source electrode 161 and a drain electrode 162 facing each other and electrically connected to a semiconductor 110 respectively, and a gate electrode 140 between the source electrode 161 and the drain electrode 162. The gate electrode 140, the source electrode 161, and the drain electrode 162 are electrically insulated from each other by an insulator, or a void space. The semiconductor 110 may be referred to as a semiconductor layer 110.

The gate electrode 140 consists of (or includes) a first part 141 between the source electrode 161 and the drain electrode 162 and a second part 143 being adjacent to the first part 141. The second part 143 may be formed in pairs disposing the first part 141 therebetween.

On the other hand, as shown in FIG. 2, a width W2 of the second part 143 may be greater than a width W1 of the first part 141. Accordingly, a planer shape of the gate electrode 140 according to some example embodiments may be a "dumbbell shape."

However, the planer shape of the gate electrode 140 according to some example embodiments is not necessarily limited to the dumbbell shape shown in FIGS. 1 and 2 but may have various shapes under the width condition between the first part 141 and the second part 143. For example, the gate electrode 140 may have a similar planer shape to a T shape, when the second part 143 contacts any one side of the first part 141, and the second part 143 may be disposed with the first part 141 in the middle and may have a different planer shape (a circle, a polygonal shape, and the like) and/or a different area from the first part 141.

On the other hand, a width W1 of the first part 141 according to some example embodiments may be narrower than a space W3 between the source electrode 161 and the drain electrode 162. Accordingly, the source electrode 161 and/or the drain electrode 162 are not overlapped with the gate electrode 140 but spaced apart therefrom with a desired (and/or predetermined) interval when seen from the top.

In some example embodiments, the width W1 of the first part is not particularly limited, but the first part 141 may have a thickness so that the gate electrode 140 may function without problems. Non-limiting examples of the width of the first part may be for example greater than or equal to about 0.5 µm, greater than or equal to about 1 µm, greater than or equal to about 3 µm, or greater than or equal to about 5 µm and for example less than or equal to about 50 µm, less than or equal to about 40 µm, less than or equal to about 30 µm, less than or equal to about 20 µm, less than or equal to about 15 µm, or less than or equal to about 10 µm.

In some example embodiments, a ratio (W3/W1) of the space W3 between the source electrode 161 and the drain electrode 162 relative to the width W1 of the first part may be for example greater than or equal to about 1.0002, greater than or equal to about 1.0003, greater than or equal to about 1.0005, greater than or equal to about 1.0006, greater than or equal to about 1.001, greater than or equal to about 1.002, greater than or equal to about 1.003, greater than or equal to about 1.004, greater than or equal to about 1.005, greater than or equal to about 1.006, greater than or equal to about 1.007, greater than or equal to about 1.008, greater than or equal to about 1.009, greater than or equal to about 1.01, or greater than or equal to about 1.02, and for example less than or equal to about 1.5, less than or equal to about 1.4, less than or equal to about 1.3, less than or equal to about 1.2, less than or equal to about 1.1, less than or equal to about 1.09, less than or equal to about 1.08, less than or equal to about 1.07, less than or equal to about 1.06, or less than or equal to about 1.05.

In general, conductors closely disposed to one another may generate parasitic capacitance. This parasitic capacitance depends on a disposition relationship among the conductors, and particularly when two conductors are disposed on two different planes, the parasitic capacitance tends to increase, as an overlapping region between two conductors is increased. For example, when the source electrode and/or the drain electrode is disposed on a different plane from the gate electrode in a thin film transistor and thus has an overlapping region with the gate electrode, performance of the thin film transistor is deteriorated, as the parasitic capacitance increases.

On the contrary, in the thin film transistor 10 according to some example embodiments, the source electrode 161 or the drain electrode 162 is not overlapped with the gate electrode 140 by forming the first part 141 to have a narrower width than a space between the source electrode 161 and the drain electrode 162.

In addition, the thin film transistor 10 according to some example embodiments may show improved device characteristics by adjusting a ratio (W3/W1) of the space W3 between the source electrode 161 and the drain electrode 162 relative to the width W1 of the first part 141 within the range and thus reducing and/or minimizing internal parasitic capacitance unnecessarily generated depending on a disposition relationship among internal constituent elements.

On the other hand, according to some example embodiments, a width W2 of the second part 143 may be equal to or wider than the space W3 between the source electrode 161 and the drain electrode 162. The second part 143 like the first part 141 also is not overlapped with the source electrode 161 and/or the drain electrode 162 but spaced apart from them with a desired (and/or predetermined) interval.

On the other hand, the width W1 of the first part 141, the width W2 of the second part 143, and the space W3 between the source electrode 161 and the drain electrode 162 may be variously adjusted within the ranges satisfying the above conditions depending on a specific material and a disposition relationship of internal constituent elements consisting of a device and the like.

Hereinafter, a specific disposition relationship of the internal constituent elements consisting of the thin film transistor 10 according to some example embodiments is illustrated referring to FIG. 1 along with FIGS. 3 and 4.

Figure 3:
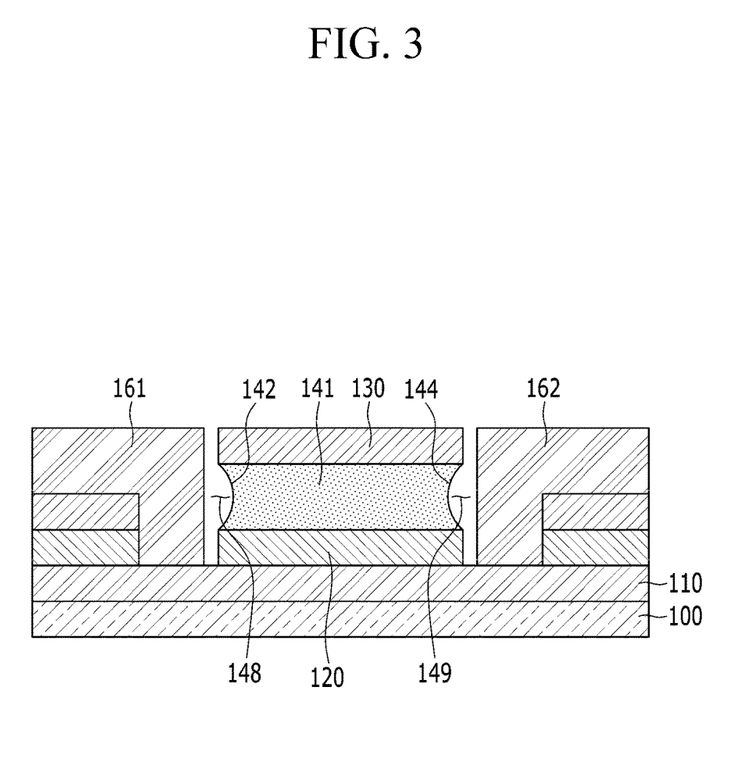
FIG. 3 is a view taken along the III-III line of FIG. 1.
Figure 4:
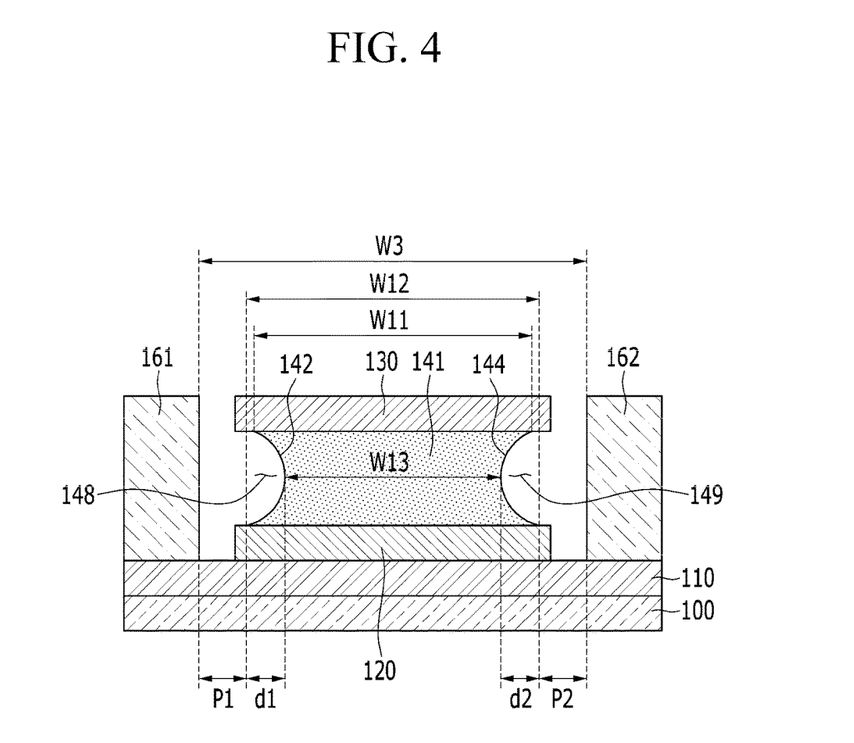

FIG. 3 is a view taken along the III-III line of FIG. 1, and FIG. 4 is an enlarged view of a part of FIG. 3.

The thin film transistor 10 according to some example embodiments may have a top gate-top contact (TGTC) structure as shown in FIG. 3.

On the other hand, the thin film transistor 10 according to some example embodiments includes a substrate 100, a semiconductor 110, a first insulation layer 120, a second insulation layer 130, a gate electrode 140, a source electrode 161, and a drain electrode 162.

The substrate 100 may include a transparent insulating material, for example a plastic, glass, quartz, and the like and may include a flexible material such as a plastic. However, a material of the substrate 100 is not limited thereto.

The semiconductor 110 is formed on the substrate 100. The semiconductor 110 may have a desired (and/or predetermined) pattern on the substrate 100 or may entirely cover the top of the substrate 100. The semiconductor 110 may include at least one of an organic semiconductor, or an inorganic semiconductor.

On the other hand, the semiconductor 110 according to some example embodiments may be an organic semiconductor. The organic semiconductor may be for example at least one of pentacene and a derivative thereof, tetrabenzoporphyrin and a derivative thereof, polyphenylenevinylene and a derivative thereof, polyfluorene and a derivative thereof, polythienylenevinylene and a derivative thereof, polythiophene and a derivative thereof, polythienothiophene and a derivative thereof, polyarylamine and a derivative thereof, phthalocyanine and a derivative thereof, metallized phthalocyanine or a halogenated derivative, perylenetetracarboxylic dianhydride (PTCDA), naphthalene tetracarboxylic dianhydride (NTCDA) or an imide derivative thereof, perylene or coronene and a substituent-containing derivatives thereof, and heteroacene or a derivative thereof.

The first insulation layer 120 is formed on the semiconductor 110. The first insulation layer 120 electrically insulates the semiconductor 110 disposed between the semiconductor 110 and the gate electrode 140 from the gate electrode 140. The first insulation layer 120 may include a contact hole is formed therein so that the source electrode 161 and the drain electrode 162 may be electrically connected to the semiconductor 110 respectively.

The first insulation layer 120 may be made of an organic material or an inorganic material. Examples of the organic material may include a soluble polymer compound such as a polyvinyl alcohol compound, a polyimide compound, a polyacryl compound, a polystyrene compound, a benzocyclobutane (BCB), or a fluorine-based compound. Examples of the inorganic material may include a silicon nitride (SiN$_x$), silicon oxide (SiO$_x$), or aluminum oxide (Al$_2$O$_3$).

The gate electrode 140 is formed on the first insulation layer 120. The gate electrode 140 is disposed on the semiconductor 110. The gate electrode 140 overlaps with a part of the semiconductor 110 and is electrically insulated from the semiconductor 110 by the first insulation layer 120.

The gate electrode 140 is connected to a gate line (not shown) transmitting a data signal, and may be made of, for example, gold (Au), copper (Cu), nickel (Ni), aluminum (Al), molybdenum (Mo), chromium (Cr), tantalum (Ta), titanium (Ti), tungsten (W), indium tin oxide (ITO), indium zinc oxide (IZO), or an alloy thereof, or polythiophene, polyaniline, polyacetylene, polypyrrole, polyphenylenevinylene, polyethylene dioxythiophene (PEDOT), polystyrene sulfonate (PSS), or a combination thereof, but is not limited thereto.

The second insulation layer 130 is formed on the gate electrode 140. The second insulation layer 130 electrically insulates the gate electrode 140 from outside and includes a contact hole so that each of the source electrode 161 and the drain electrode 162 may electrically be connected to the semiconductor 110 like the first insulation layer 120.

The second insulation layer 130 may be made of an organic material or an inorganic material, and examples of the organic material may include a soluble polymer compound such as a polyvinyl alcohol compound, a polyimide compound, a polyacryl compound, a polystyrene compound, benzocyclobutane (BCB), fluorine-based compound or a fluorine-based compound and examples of the inorganic material may include silicon nitride (SiN$_x$), silicon oxide (SiO$_2$), or aluminum oxide (Al$_2$O$_3$).

On the other hand, the source electrode 161 and the drain electrode 162 face each other while disposing the gate electrode 140 therebetween and are electrically connected to the semiconductor 110 through the first insulation layer 120 and the second insulation layer 130.

The source electrode 161 is connected to a data line transferring a data signal. The source electrode 161 and the drain electrode 162 may be for example made of gold (Au), copper (Cu), nickel (Ni), aluminum (Al), molybdenum (Mo), chromium (Cr), tantalum (Ta), titanium (Ti), tungsten (W), indium tin oxide (ITO), indium zinc oxide (IZO), or an alloy thereof, or polythiophene, polyaniline, polyacetylene, polypyrrole, polyphenylenevinylene, polyethylene dioxythiophene (PEDOT), polystyrenesulfonate (PSS), and a combination thereof, but is not limited thereto.

Since the thin film transistor 10 according to some example embodiments may have a top contact structure that the source electrode 161 and the drain electrode 162 are electrically connected to the upper surface of the semiconductor 110, contact resistance between the source electrode 161 and the semiconductor 110 and between the drain electrode 162 and the semiconductor 110 is easy to reduce compared with a bottom contact structure where the source electrode and the drain electrode are electrically connected to the lower surface of the semiconductor 110. Accordingly, the thin film transistor 10 may exhibit excellent device characteristics.

On the other hand, in the thin film transistor 10 according to some example embodiments, the first part 141 of the gate electrode 140 is disposed between the source electrode 161 and the drain electrode 162 and includes a first side 142 and a second side 144 as shown in FIG. 3, and a groove is formed in either one of the first side 142 and the second side 144.

A width W11 of the upper surface of the first part 141 may be the same as or different from a width W12 of the lower surface thereof. FIG. 4 shows a case that the width W11 of the upper surface of the first part 141 is different from the width W12 of the lower surface thereof, and herein, a longer one between the width W11 of the upper surface of the first part 141 and the width W12 of the lower surface thereof is the width W1 of the first part 141 as shown in FIG. 2.

The first side 142 is spaced apart from the source electrode 161 with a desired (and/or predetermined) interval each other, while the second side 144 is spaced apart from the drain electrode 162 with a desired (and/or predetermined) interval each other. Each space between the first side 142 and the source electrode 161 and between the second side 144 and the drain electrode 162 may be empty or filled with an insulating material.

In some example embodiments, the shortest distance between the first side 142 and the source electrode 161 is defined as a first spacing distance P1, and the shortest distance between the second side 144 and the drain electrode 162 is defined as a second spacing distance P2.

In some example embodiments, when the first spacing distance P1 and the second spacing distance P2 have too large a difference, the gate electrode 140 may produce very a few charge carriers and thus lower carrier density, but when the first spacing distance P1 and the second spacing distance P2 have too small a difference, parasitic capacitance between the source electrode 161 and the first side 142 and/or between the drain electrode 162 and the second side 144 may be increased.

Accordingly, the first spacing distance P1 and the second spacing distance P2 reducing and/or minimizing the parasitic capacitance as well as maintaining the carrier density in an appropriate level may be respectively, for example, greater than or equal to about 1 μm, greater than or equal to about 2 μm, greater than or equal to about 3 μm, greater than or equal to about 4 μm, or greater than or equal to about 5 μm but for example less than or equal to about 15 μm, less than or equal to about 14 μm, less than or equal to about 13 μm, less than or equal to about 12 μm, less than or equal to about 11 μm, or less than or equal to about 10 μm.

In some example embodiments, the groove may be formed by surface-processing, for example, etching the first side 142 and/or the second side 144 through the following process.

The groove may have a dented shape from each upper and lower side of the first part 141 toward a central point thereof. In other words, the first part 141 may have a width gradually tapered toward the central point from each upper and lower side. The groove makes a central width W13 of the first part 141 narrower than the width W11 of the upper side or the width W12 of the lower side.

In some example embodiments, the groove may have an U shape as shown in FIGS. 3 and 4 but is not limited thereto and may have various shapes such as a V shape and the like.

The groove may be respectively formed at the first side 142 and the second side 144. In some example embodiments, the groove at the first side 142 is defined as a first groove 148, while the groove at the second side 144 is defined as a second groove 149. Because of the grooves 148 and 149, sidewalls of the first part 141 of the gate electrode 140 may have a concave shape.

In some example embodiments, when the first and second grooves 148 and 149 are too deep, the gate electrode 140 produces very a few charge carrier and thus may reduce carrier density and thus increase channel resistance, while when the first and second grooves 148 and 149 are too shallow, parasitic capacitance between the source electrode 161 and the first side 142 and/or between the drain electrode 162 and the second side 144 may be increased.

Accordingly, a depth d1 of the first groove 148 and a depth d2 of the second groove 149 reducing and/or minimizing the parasitic capacitance as well as maintaining the carrier density in an appropriate level may be, for example greater than or equal to about 0.01 µm, greater than or equal to about 0.05 µm, or greater than or equal to about 0.1 µm but for example less than or equal to about 5 µm, less than or equal to about 4 µm, less than or equal to about 3 µm, less than or equal to about 2 µm, less than or equal to about 1 µm, less than or equal to about 0.9 µm, or less than or equal to about 0.8 µm.

The thin film transistor 10 according to some example embodiments may satisfy the width conditions of the first part 141 and the second part 143 and the space condition between the source electrode 161 and the drain electrode 162 and also, more satisfy the depth d1 and d2 conditions of the first and second grooved 148 and 149 formed at both sides of the first part 141 and/or the first and second spacing distance P1 and P2 conditions of the first part 141 respectively from the source electrode 161 and the drain electrode 162.

Accordingly, device characteristics of the thin film transistor 10 having a top gate-top contact structure may be improved by optimizing a width of the gate electrode 140 from each source electrode 161 and drain electrode 162 depending on various design conditions of internal constituent elements as well as adjusting the gate electrode 140 not to be overlapped with the source electrode 161 and the drain electrode 162.

In addition, the thin film transistor 10 having the top gate-top contact structure may be widely applied to various display devices as well as a flat panel display by easily adjusting the above conditions depending on various design conditions of internal constituent elements consisting of a device.

According to some example embodiments, an electronic device includes the thin film transistor 10. The electronic device may be for example a display device such as a liquid crystal display (LCD), an organic light emitting diode device, or the like or a sensing device such as an electronic tag (RFI), an electronic sensor, and the like.

The thin film transistor 10 may replace a thin film transistor having a conventional bottom gate-top contact structure by optimizing a width of the gate electrode 140 with the source electrode 161 and the drain electrode 162 depending on various design conditions of internal constituent elements consisting of a device. Accordingly, the thin film transistor 10 may be easily applied to a large-sized display device such as large-sized TV and the like and a physically modifiable display device such as a flexible display and a rollable display other than small and medium-sized display devices.

Hereinafter, referring to FIGS. 5 to 11, a method of making a thin film transistor according to some example embodiments is described.

FIGS. 5 to 11 are views sequentially showing a process of making a thin film transistor according to some example embodiments.

A method of making thin film transistor according to some example embodiments includes forming the semiconductor 110 on the substrate 100, forming the first insulation layer 120 on the semiconductor 110, forming the gate electrode 140 on the first insulation layer 120, and forming the second insulation layer 130 on the gate electrode 140. The method of making the thin film transistor may further include forming a contact hole 150 through at least one part of the first insulation layer 120, the second insulation layer 130, and the gate electrode 140, and forming the source electrode 161 and the drain electrode 162 electrically connected to the semiconductor 110 through the contact hole 150.

Figure 5:
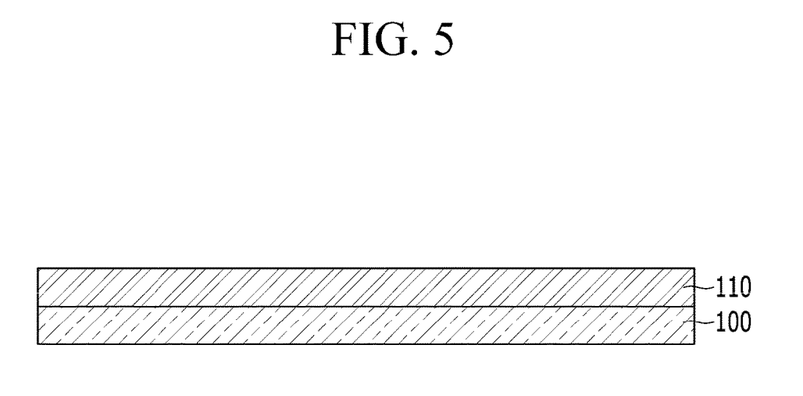

First, as shown in FIG. 5, the semiconductor 110 is formed on the substrate 100. The semiconductor 110 may be for example formed in a dry process such as chemical vapor deposition (CVD), a solution process such as spin coating and inkjet printing, an organic material deposit, or the like. On the other hand, the semiconductor 110 according to some example embodiments may be additionally patterned to have a desired (and/or predetermined) pattern.

Figure 6:
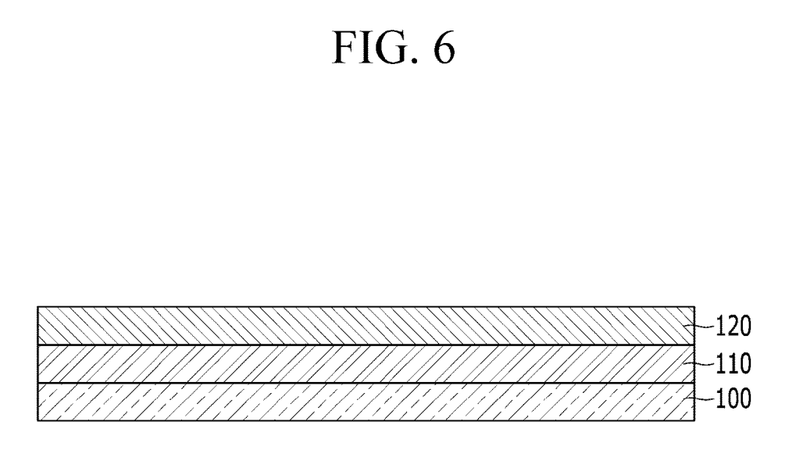

Subsequently, as shown in FIG. 6, the first insulation layer 120 is formed on the semiconductor 110. The first insulation layer 120 may be for example formed in a dry process such as chemical vapor deposition (CVD) or a solution process such as spin coating and/or Inkjet printing.

Figure 7:
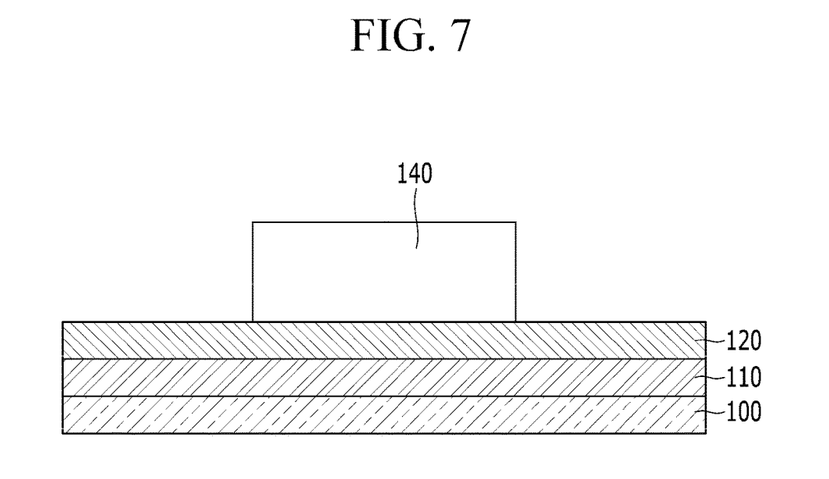

Then, as shown in FIG. 7, the gate electrode 140 is formed on the first insulation layer 120 by depositing a gate electrode material in a method of sputtering and the like and then. The gate electrode material may be patterned to have a desired (and/or predetermined) pattern. The gate electrode 140 is overlapped with a partial region of the semiconductor 110. The rest region of the gate electrode 140 not overlapped with the semiconductor 110 may be connected to a gate line transporting a gate signal or form the gate line.

Figure 8:
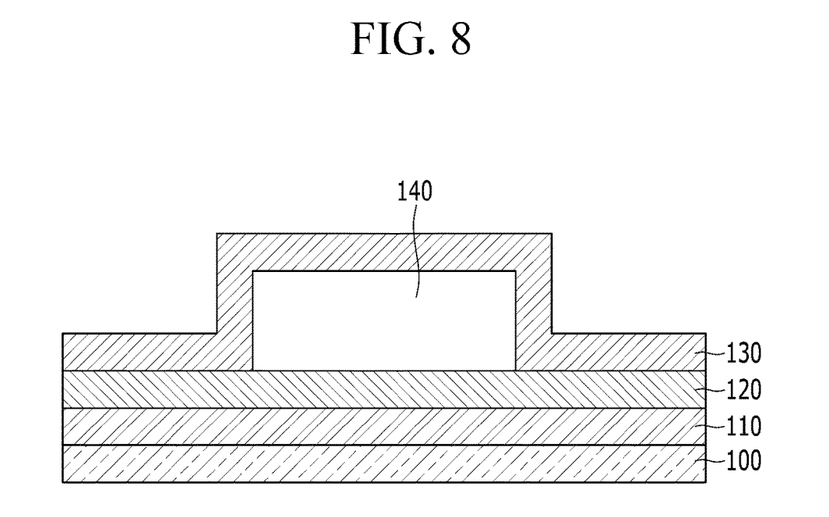

Then, as shown in FIG. 8, the second insulation layer 130 is formed on the gate electrode 140. The second insulation layer 130 may be for example formed in a dry process such as chemical vapor deposition (CVD) or a solution process such as spin coating and Inkjet printing.

Figure 9:
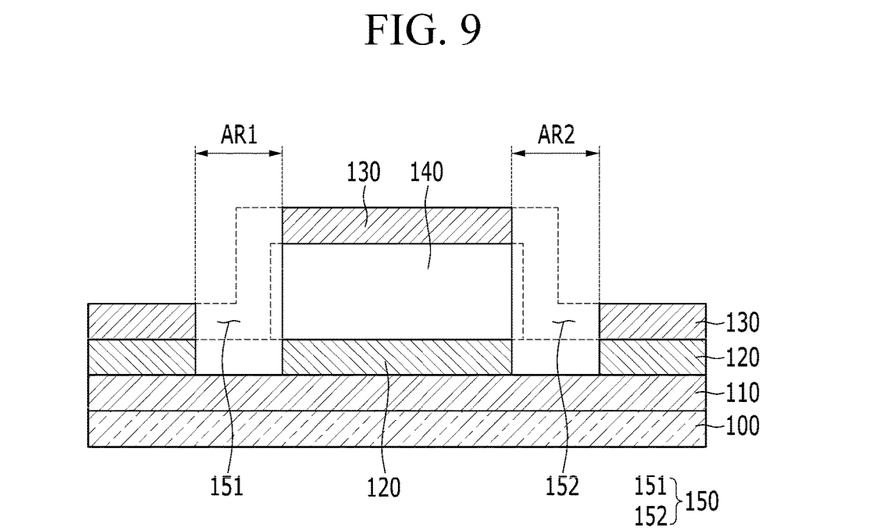

Subsequently, as shown in FIG. 9, a contact hole 150 penetrating the first insulation layer 120, the second insulation layer 130, and the gate electrode 140 is formed. In some example embodiments, the contact hole 150 includes a first contact hole 151 where a source electrode will be formed and a second contact hole 152 where a drain electrode will be formed.

On the other hand, the forming of the contact hole 150 includes designating a region overlapped with at least a part of the gate electrode 140 as a contact hole forming region.

The designating of the contact hole forming region includes designating a region overlapped with one side of the gate electrode 140, that is, a partial left side of the gate electrode 140 with a reference to FIG. 9 as a first contact hole forming region AR1 and a region overlapped with the other side of the gate electrode 140, that is, a partial right side of the gate electrode 140 with a reference to FIG. 9 as a second contact hole forming region AR2.

In addition, the forming of the contact hole 150 includes etching and removing the first and second insulation layers 120 and 130 respectively overlapped with the first and second contact hole forming regions AR1 and AR2 and the partial left and right sides of the gate electrode 140 as marked with a dotted line in FIG. 9.

Accordingly, the gate electrode 140 may have a dumbbell planer shape consisting of the first part 141 and the second part 143 as shown in FIG. 1. In other words, the gate electrode 140 is divided into the first part 141 having a narrower width due to the etching of the gate electrode 140 by etching and removing a part of the gate electrode 140 with the first and second insulation layers 120 and 130, and the second part 143 neighboring the first part 141 during the forming of the contact hole 150, and both sides of the first part 141 are externally exposed through the contact hole 150 as shown in FIG. 9.

Figure 10:
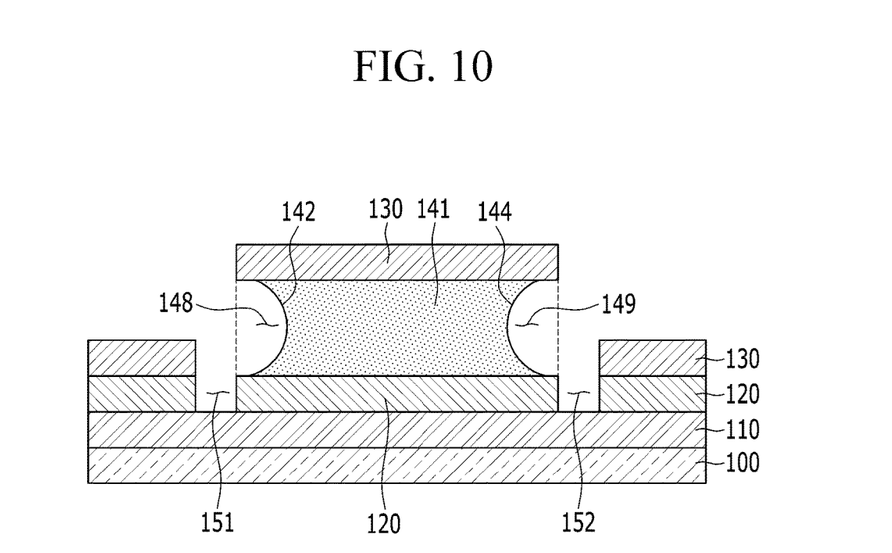

Subsequently, as shown in FIG. 10, both sides of the first part 141 externally exposed through the contact hole 150 are surface-processed to form the first and second grooves 148 and 149 having a desired (and/or predetermined) depth. The surface process may be an etching process, and the first and second grooves 148 and 149 may be dented from the upper and lower sides of the first part 141 toward the central part thereof.

On the other hand, the forming of the contact hole 150 according to some example embodiments is not necessarily limited to an order shown in FIGS. 9 and 10 but includes a combination of various methods capable of forming the contact hole 150 and processing both exposed sides of the first part 141.

For example, the forming of the contact hole 150 in some example embodiments may include etching and removing the second insulation layer 130 and the gate electrode 140, except for the first insulation layer 120, along the first and second contact hole forming regions AR1 and AR2, surface-processing both exposed sides of the first part 141 to form the first and second grooves 148 and 149, and etching the first insulation layer 120 to expose a part of the semiconductor 110.

Figure 11:
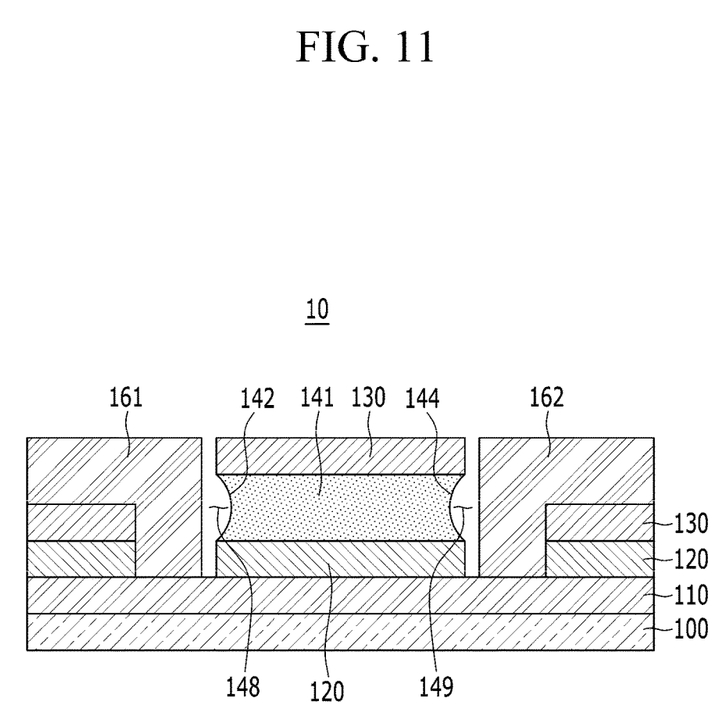

Subsequently, as shown in FIG. 11, the source electrode 161 through the first contact hole 151 and the drain electrode 162 through the second contact hole 152 are respectively formed. In some example embodiments, the source electrode 161 and the drain electrode 162 may be formed through sputtering or an atomic layer deposition. On the other hand, the source electrode 161 and the drain electrode 162 are spaced apart from the first part 141 with a desired (and/or predetermined) interval and electrically insulated therefrom.

Subsequently, the source electrode 161 and the drain electrode 162 are patterned to form a data line, resultantly making the thin film transistor 10 having a top gate-top contact structure according to some example embodiments.

According to some example embodiments, a method of making the thin film transistor 10 may increase each area for the source electrode 161 and the drain electrode 162 by etching and removing a part of the gate electrode 140 and easily control the gate electrode 140 not to be overlapped with the source electrode 161 and/or the drain electrode 162.

In addition, both sides of the etched first part 141 are surface-processed to easily control a space between the first part 141 and the source electrode 161 and/or a space between the first part 141 and the drain electrode 162.

While this disclosure has been described in connection with what is presently considered to be practical example embodiments, it is to be understood that inventive concepts are not limited to the disclosed embodiments, but, on the contrary, is intended to cover various modifications and equivalent arrangements included within the spirit and scope of the appended claims.

What is claimed is:

1. A thin film transistor, comprising:
   a semiconductor layer;
   a gate electrode on the semiconductor layer, the gate electrode overlapping with a part of the semiconductor layer,
   the gate electrode including a first part and a second part adjacent to the first part, a width of the second part being greater than a width of the first part;
   a first insulation layer between the semiconductor layer and the gate electrode;
   a second insulation layer on the gate electrode; and
   a source electrode and a drain electrode on the semiconductor layer and arranged such that the first part of the gate electrode is between the source electrode and the drain electrode,
   the source electrode and the drain electrode being electrically connected to the semiconductor layer through the first insulation layer and the second insulation layer respectively, and
   a space between the source electrode and the drain electrode being greater than the width of the first part, wherein
   the first part of the gate electrode includes a first side and a second side,
   the first side faces the source electrode,
   the second side faces the drain electrode, and
   at least one of the first side and the second side includes a groove having a dented shape that tapers gradually from an upper side of the first part and a lower side of the first part toward a central part of the first part.

2. The thin film transistor of claim 1, wherein a depth of the groove ranges from about 0.1 µm to about 1 µm.

3. The thin film transistor of claim 1, wherein when a first spacing distance is a shortest distance between the first side and the source electrode, and
   the first spacing distance ranges from about 5 µm to about 10 µm.

4. The thin film transistor of claim 1, wherein when a second spacing distance is a shortest distance between the second side and the drain electrode,
   the second spacing distance ranges from about 5 µm to about 10 µm.

5. The thin film transistor of claim 1, wherein a ratio of the space between the source electrode and the drain electrode relative to the width of the first part of the gate electrode ranges from about 1.005 to about 1.05.

6. The thin film transistor of claim 1, wherein the width of the second part is equal to or larger than a space between the gate electrode and the source electrode.

7. The thin film transistor of claim 1, wherein
   the gate electrode includes two of the second part, and
   the first part is between the two of the second part.

8. The thin film transistor of claim 1, wherein the semiconductor layer is an organic semiconductor layer.

9. An electronic device comprising:
   the thin film transistor of claim 1.

10. The electronic device of claim 9, wherein the electronic device is at least one of a liquid crystal display (LCD), an organic light emitting diode device, an electronic tag, or an electronic sensor.

11. A method of making a thin film transistor, the method comprising
   forming a first insulation layer on a semiconductor layer;
   forming a gate electrode on the first insulation layer, the gate electrode overlapping with a part of the semiconductor layer, the gate electrode including a first part and a second part adjacent to the first part, a width of the second part being greater than a width of the first part;
   forming a second insulation layer on the gate electrode;
   forming a contact hole through at least one part of the first insulation layer, the second insulation layer, and the gate electrode; and
   forming a source electrode and a drain electrode electrically connected to the semiconductor layer through the contact hole, the source electrode and the drain electrode being arranged such that the first part of the gate electrode is between the source electrode and the drain electrode, and a space between the source electrode and the drain electrode being greater than the width of the first part, wherein the forming the contact hole includes designating a region overlapped with at least a part of the gate electrode as a contact hole forming region, and removing the contact hole forming region designated in the gate electrode and the second insulation layer, the first part of the gate electrode includes a first side and a second side, the first side facing the source electrode and the second side facing the drain electrode, and the forming the contact hole includes surface-processing of an exposed part of the gate electrode through the contact hole, at least one of the first side and the second side being thereby formed with a groove having a dented shape that tapers gradually from an upper side of the first part and a lower side of the first part toward a central part of the first part.

12. The method of claim 11, wherein the surface-processing includes etching the exposed part of the gate electrode through the contact hole.

13. The method of claim 11, further comprising:
etching the first insulation layer in the contact hole forming region to expose a part of the semiconductor layer after the removing the contact hole forming region designated in the gate electrode and the second insulation layer.

14. The method of claim 11, wherein the designating the contact hole forming region includes:
designating a region overlapped with one side of the gate electrode as a first contact hole forming region, and
designating a region overlapped with an other side of the gate electrode opposite to the first contact hole forming region with a reference to the gate electrode as a second contact hole forming region.

15. The method of claim 11, wherein
the semiconductor layer is an organic semiconductor layer, and
the semiconductor layer is formed through a solution process or a deposition process.

16. The method of claim 11, wherein the forming the source electrode and the drain electrode includes a sputtering deposition or an atomic layer deposition.

17. A thin film transistor, comprising:
a semiconductor layer;
a source electrode and a drain electrode on the semiconductor layer, the source electrode and the drain electrode being spaced apart from each other by a first space and being electrically connected to the semiconductor layer;
a first insulation layer on the semiconductor layer; and
a gate electrode on the first insulation layer,
the gate electrode extending through the first space between the source electrode and the drain electrode,
the gate electrode including a first part connected to a second part,
the first part of the gate electrode extending through the first space,
a width of the first part being less than a width of the first space,
a width of the second part being greater than a width of the first part, and
a sidewall of the first part of the gate electrode including a groove having a dented shape that tapers gradually from an upper side of the first part and a lower side of the first part toward a central part of the first part.

18. The thin film transistor of claim 17, wherein the width of the second part is greater than the width of the first space.

19. The thin film transistor of claim 17, wherein
the gate electrode has a dumbbell shape, and
the second part of the gate electrode corresponds to one end of the gate electrode.

20. The thin film transistor of claim 17, further comprising:
a second insulation layer, wherein
a first portion of the second insulation layer covers a top surface of the gate electrode,
a second portion of the second insulation is between a top surface of the first insulation layer and a bottom surface of the source electrode, and
a third portion of the second insulation layer is between the top surface of the first insulation layer and a bottom surface of the drain electrode.

21. The thin film transistor of claim 17, wherein
the semiconductor layer is an organic semiconductor layer.

* * * * *